United States Patent
Kunz, Jr. et al.

(10) Patent No.: US 9,172,243 B2
(45) Date of Patent: Oct. 27, 2015

(54) SHUT-OFF CIRCUITS FOR LATCHED ACTIVE ESD FET

(71) Applicant: Texas Instruments Incorporated, Dallas, TX (US)

(72) Inventors: John Eric Kunz, Jr., Allen, TX (US); Jonathan Scott Brodsky, Richardson, TX (US)

(73) Assignee: TEXAS INSTRUMENTS CORPORATED, Dallas, TX (US)

( * ) Notice: Subject to any disclaimer, the term of this patent is extended or adjusted under 35 U.S.C. 154(b) by 44 days.

(21) Appl. No.: 14/101,429

(22) Filed: Dec. 10, 2013

(65) Prior Publication Data

US 2014/0185168 A1 Jul. 3, 2014

Related U.S. Application Data

(60) Provisional application No. 61/746,899, filed on Dec. 28, 2012.

(51) Int. Cl.
*H02H 3/22* (2006.01)
*H02H 9/04* (2006.01)
*H01L 27/02* (2006.01)

(52) U.S. Cl.
CPC ............ *H02H 9/046* (2013.01); *H02H 9/048* (2013.01); *H01L 27/0248* (2013.01); *H02H 9/04* (2013.01); *H02H 9/043* (2013.01)

(58) Field of Classification Search
USPC .................................... 361/56, 111
See application file for complete search history.

(56) References Cited

U.S. PATENT DOCUMENTS

| 7,929,263 | B1 * | 4/2011 | Peachey et al. ............... 361/56 |
| 8,879,222 | B2 * | 11/2014 | Singh ........................... 361/56 |
| 2010/0149701 | A1 * | 6/2010 | Drapkin et al. .............. 361/56 |

\* cited by examiner

*Primary Examiner* — Danny Nguyen
(74) *Attorney, Agent, or Firm* — Tuenlap D. Chan; Frank D. Cimino

(57) ABSTRACT

An integrated circuit may include an over-capability detection circuit coupled to an I/O pad which provides a shut-off signal to a latch controlling an ESD protection shunting component. The ESD protection shunting component is coupled between the I/O pad and a reference node of the integrated circuit. The over-capability detection circuit provides the shut-off signal when safe operating conditions are resumed after a voltage excursion at the I/O pad. After receiving the shut-off signal, the latch biases the ESD protection shunting component into an off-state.

18 Claims, 5 Drawing Sheets

US 9,172,243 B2

SHUT-OFF CIRCUITS FOR LATCHED ACTIVE ESD FET

CROSS-REFERENCE TO RELATED APPLICATIONS

This application claims the benefit of priority under U.S.C. §119(e) of U.S. Provisional Application 61/746,899 filed Dec. 28, 2012, which is hereby incorporated by reference in its entirety.

FIELD OF THE INVENTION

This invention relates to the field of integrated circuits. More particularly, this invention relates to electrostatic discharge (ESD) circuits in integrated circuits.

BACKGROUND OF THE INVENTION

Electrostatic discharge (ESD) is a continuing problem in the design, manufacture, and utilization of integrated circuits (ICs). A voltage vs time plot of a typical ESD event 100 is shown in FIG. 1. The voltage (and/or current) rises very rapidly, and falls quickly thereafter. An integrated circuit may include an ESD protection shunting component, such as an ESD protection field effect transistor (FET), connected between an input/output (I/O) pad and a reference node, for example a Vss or ground node, of the integrated circuit. The integrated circuit may further include an ESD detection circuit with a "sense" functionality coupled to the I/O pad and with a "signal out" functionality which sends a signal to a latch of the integrated circuit when an ESD event occurs. The latch may have a "gate bias" functionality which maintains an on-state gate bias at a gate node of the ESD protection FET while the ESD detection circuit signals that the ESD event is occurring. The latch may provide efficient shunting of the I/O pad to the reference node by providing a constant on-state gate bias regardless of a varying strength of the signal from the ESD detection circuit.

A problem arises when the ESD detection circuit is triggered by a voltage excursion when the integrated circuit is coupled to a power supply for normal operation. A voltage vs time plot of such a voltage excursion 102, also known as an electrical overstress (EOS) event 102, and ensuing power application 104 is also shown in FIG. 1. The EOS event 102 causes the ESD detection circuit to initiate the signal to the latch to provide the on-state bias to the ESD protection FET. The application of power 104 to the integrated circuit causes the ESD detection circuit to maintain the signal to the latch which then maintains the ESD protection FET in an on state. Thus, the ESD protection FET may be undesirably left on during normal operation of the integrated circuit, possibly disadvantageously leading to failure of the ESD protection FET and possibly to failure of the integrated circuit. EOS events as described above may occur when the power supply of a laptop or cell phone is plugged into a socket before it is plugged into the laptop of cell phone.

The risetime of the voltage excursion 102 can be slower than the risetime of the ESD event 100, as depicted in FIG. 1. Currently, circuits that trigger the ESD detection circuit with very fast rise times but do not trigger with less fast rise times are being used to avoid latching the ESD protection FET gate during an EOS event, with partial success. However, these solutions are not immune to triggering under EOS events with faster risetimes which trigger the ESD detection circuit.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may include an over-capability detection circuit coupled to an I/O pad which provides a shut-off signal to a latch controlling an ESD protection shunting component. The ESD protection shunting component is coupled between the I/O pad and a reference node of the integrated circuit. The over-capability detection circuit provides the shut-off signal when safe operating conditions are resumed after a voltage excursion at the I/O pad. After receiving the shut-off signal, the latch biases the ESD protection shunting component into an off-state.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may include an over-capability detection circuit coupled to an I/O pad which provides a shut-off signal to a latch controlling an ESD protection shunting component. The ESD protection shunting component is coupled between the I/O pad and a reference node of the integrated circuit. The over-capability detection circuit provides the shut-off signal when safe operating conditions are resumed after a voltage excursion at the I/O pad. After receiving the shut-off signal, the latch biases the ESD protection shunting component into an off-state.

Figure 2:
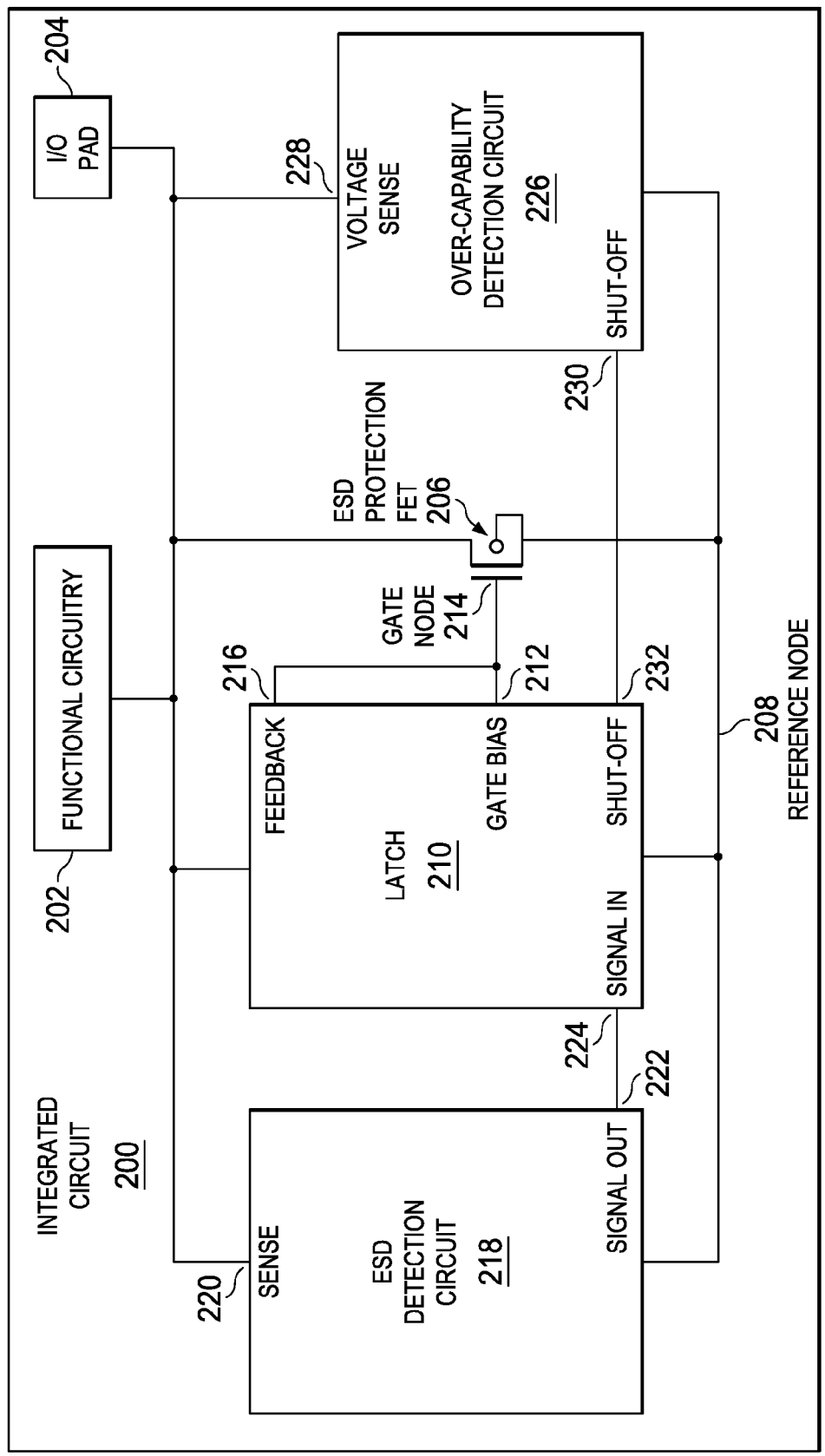
FIG. 2 is a block schematic diagram of an integrated circuit containing an example over-capability detection circuit.

FIG. 2 is a block schematic diagram of an integrated circuit containing an example over-capability detection circuit. The integrated circuit 200 includes functional circuitry 202 such as logic circuits, memory circuits and/or analog circuits. An I/O pad 204 of the integrated circuit 200 is coupled to the functional circuitry 202. An ESD protection shunting component 206, which in the examples described herein will be depicted as an ESD protection FET 206, is coupled between the I/O pad 204 and a reference node 208 of the integrated circuit 200. The reference node 208 may be, for example a ground node, possibly referred to as a Vss node in a version of the integrated circuit 200 with a significant amount of logic circuits. The integrated circuit 200 includes a latch 210 which has a gate bias functionality 212 coupled to a gate node 214 of the ESD protection FET 206. The gate node 214 is also coupled to a feedback port 216 of the latch 210. The latch 210 may possibly be coupled to the I/O pad 204 and/or the reference node 208 as depicted in FIG. 2. The integrated circuit 200 includes an ESD detection circuit 218 coupled to the I/O pad 204 through a sense functionality 220 and to the reference node 208. The ESD detection circuit 218 is coupled to the latch 210 through a signal-out port 222 of the ESD detection circuit 218 and through a signal-in port 224 of the latch 210.

The integrated circuit 200 further includes an over-capability detection circuit 226 with a voltage sense functionality 228 coupled to the I/O pad 204. The over-capability detection circuit 226 also has a shut-off output port 230 which is coupled to a shut-off input port 232 of the latch 210. The over-capability detection circuit 226 may also be coupled to the reference node 208 as depicted in FIG. 2, or to another node of the integrated circuit 200.

The ESD protection FET 206 is normally in an off state. When an ESD event occurs at the I/O pad 204, the sense functionality 220 of the ESD detection circuit 218 detects a voltage excursion on the I/O pad 204 due to the ESD event and sends an ESD signal through the signal-out port 222 to the latch 210 through the signal-in port 224. Upon receiving the ESD signal from the ESD detection circuit 218, the latch 210 provides an on-state gate bias from the gate bias functionality 212 to the gate node 214, which turns on the ESD protection FET 206, so as to protect the functional circuitry 202. The latch 210 continues to provide the on-state bias to the gate node 214 until the voltage excursion on the I/O pad 204 ceases and the ESD detection circuit 218 ceases to provide the ESD signal to the latch 210.

Figure 1:
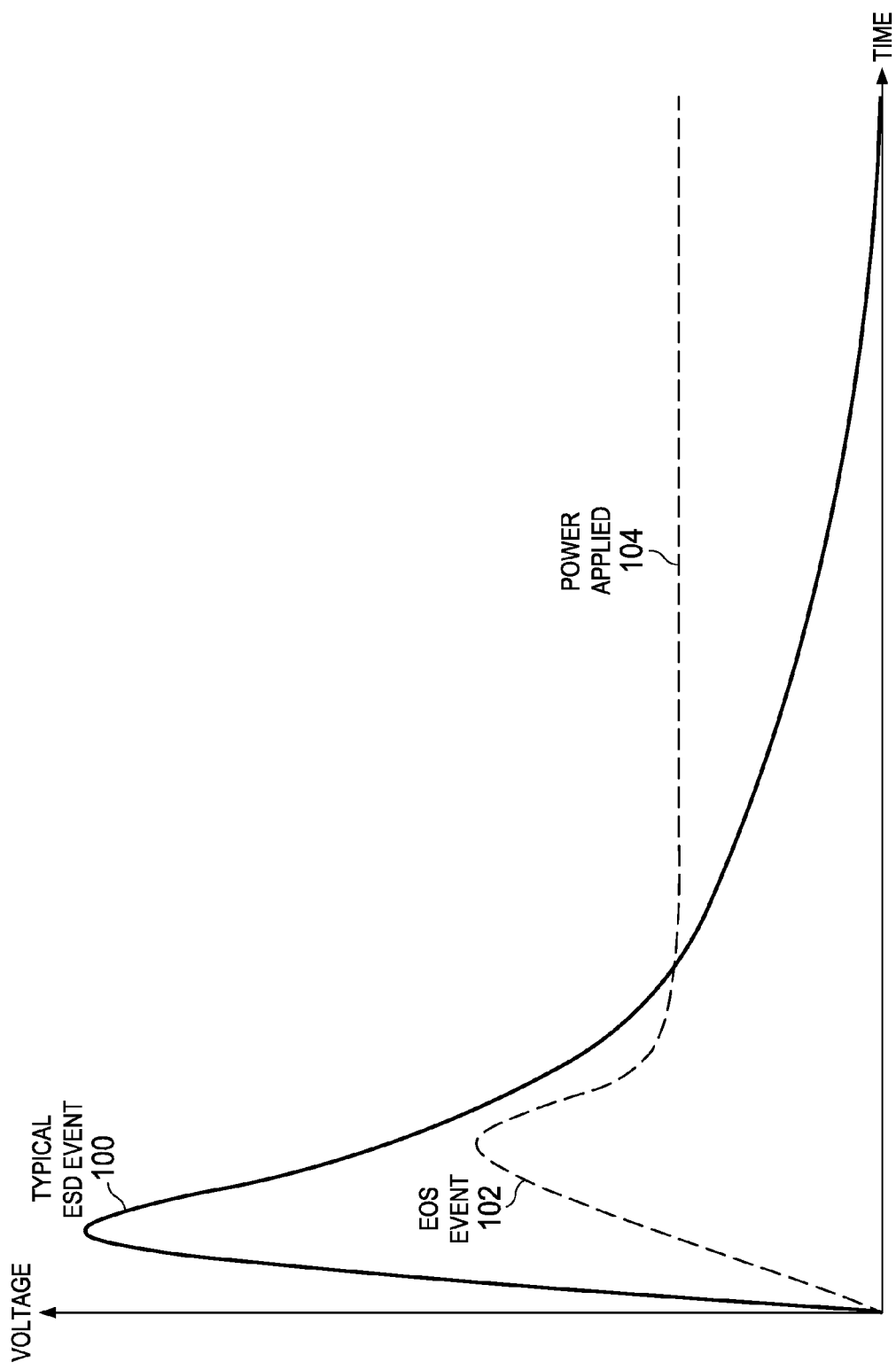
FIG. 1 is a voltage vs time plot of a typical ESD event and a voltage excursion with an ensuing power application.

When an EOS event occurs, such as that discussed in reference to FIG. 1, the sense functionality 220 of the ESD detection circuit 218 detects a voltage excursion due to the EOS event and sends an ESD signal to the latch 210, which provides the on-state gate bias to the gate node 214 which then turns on the ESD protection FET 206. When the voltage on the I/O pad 204 returns to a safe operating condition, the ESD detection circuit 218 may continue to provide the ESD signal to the latch 210 because the voltage on the I/O pad 204 may not have dropped low enough to deactivate the sense functionality 220 of the ESD detection circuit 218. When the safe operating condition is detected by the voltage sense functionality 228 of the over-capability detection circuit 226, a shut-off signal is provided through the shut-off output port 230 to the latch 210 through the shut-off input port 232. Upon receiving the shut-off signal, the latch 210 provides an off-state bias through the gate bias functionality 212 to the gate node 214 and so turns off the ESD protection FET 206. Using the over-capability detection circuit 226 to turn off the ESD protection FET 206 when the safe operating condition is obtained may advantageously reduce stress on the ESD protection FET 206 and hence provide a desired level of reliability for the integrated circuit 200.

The integrated circuit 200 may include a plurality of I/O pads 204, each having separate instances of the ESD protection FET 206, the latch 210, the ESD detection circuit 218 and the over-capability detection circuit 226, configured as described with respect to FIG. 1. In an alternate version of the instant example, the integrated circuit 200 may include a plurality of I/O pads 204, of which a portion have separate instances of the ESD protection FET 206, the latch 210, the ESD detection circuit 218 and the over-capability detection circuit 226, and other I/O pads 204 have different ESD protection schemes.

Figure 3:
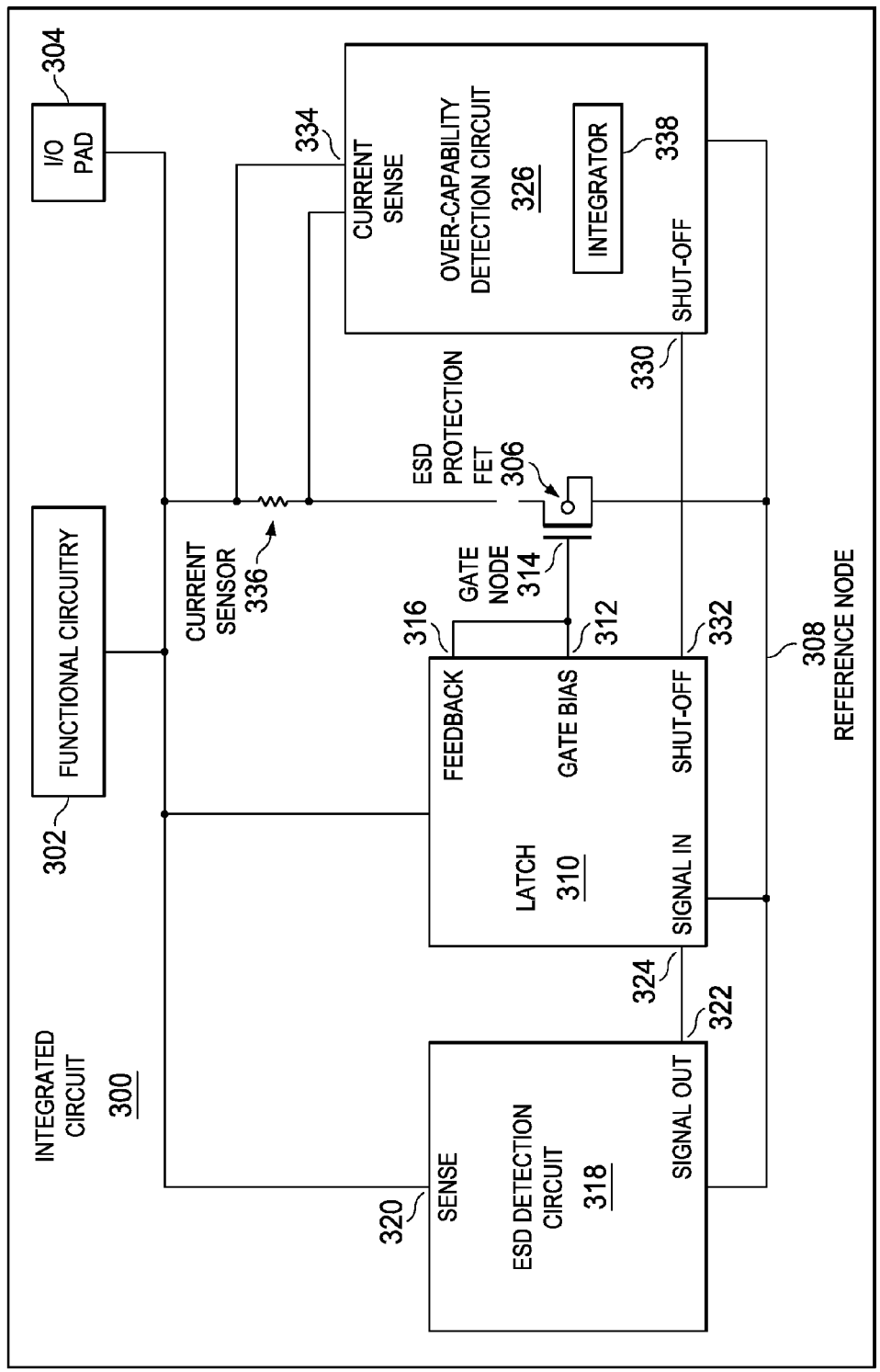
FIG. 3 is a block schematic diagram of an integrated circuit containing another example over-capability detection circuit.

FIG. 3 is a block schematic diagram of an integrated circuit containing another example over-capability detection circuit. The integrated circuit 300 includes functional circuitry 302, an I/O pad 304 coupled to the functional circuitry 302, and an ESD protection FET 306 coupled between the I/O pad 304 and a reference node 308. The integrated circuit 300 includes a latch 310 which has a gate bias functionality 312 coupled to a gate node 314 of the ESD protection FET 306. The gate node 314 is coupled to a feedback port 316 of the latch 310. The integrated circuit 300 includes an ESD detection circuit 318 coupled to the I/O pad 304 through a sense functionality 320 and to the reference node 308. The ESD detection circuit 318 is coupled to the latch 310 through a signal-out port 322 of the ESD detection circuit 318 and through a signal-in port 324 of the latch 310.

The integrated circuit 300 further includes an over-capability detection circuit 326 with a current sense functionality 334 coupled to a current sensor 336 in series with the ESD protection FET 306. The current sensor 336 is depicted in FIG. 3 as a resistor 336, but may be any form of current sensor. The current sensor 336 may be coupled, for example, between the I/O pad 304 and the ESD protection FET 306 as shown in FIG. 3, or between the ESD protection FET 306 and the reference node 308. The over-capability detection circuit 326 has a shut-off output port 330 which is coupled to a shut-off input port 332 of the latch 310.

When an ESD event occurs at the I/O pad 304, the ESD protection FET 306 is turned on by the combined action of the ESD detection circuit 318 and the latch 310 to protect the functional circuitry 302, as described in reference to FIG. 2. When an EOS event occurs, the ESD protection FET 306 is turned on by the combined action of the ESD detection circuit 318 and the latch 310, causing a large amount of current to flow through the ESD protection FET 306. The current through the ESD protection FET 306 is sensed by the current sense functionality 334 of the over-capability detection circuit 326. When the current through the ESD protection FET 306 drops to a level that indicates a safe operating condition has been attained, a shut-off signal is provided through the shut-off output port 330 to the latch 310 through the shut-off input port 332. The latch 310 then provides an off-state bias through the gate bias functionality 312 to the gate node 314 and so turns off the ESD protection FET 306. Using the current sensor 336 and the current sense functionality 334 may advantageously permit use of low-voltage components compared to direct voltage sensing of the I/O pad 304.

Reliability of the ESD protection FET 306 may be a function of the total charge through the ESD protection FET 306. The over-capability detection circuit 326 may optionally have an integrator 338 which is operable to integrate a signal from the current sense functionality 334 to provide an estimate of total charge through the ESD protection FET 306 in a time period of interest. The time period of interest may start, for example, when the ESD protection FET 306 is turned on. The integrator 338 may provide an estimate of a total charge through the ESD protection FET 306 during the EOS event, which may be used to determine a desired time to provide the shut-off signal to the latch 310. Using the integrator 338 to estimate attainment of the safe operating condition may advantageously provide a desired balance between protection of the functional circuitry 302 and reliability of the ESD protection FET 306.

Figure 4:
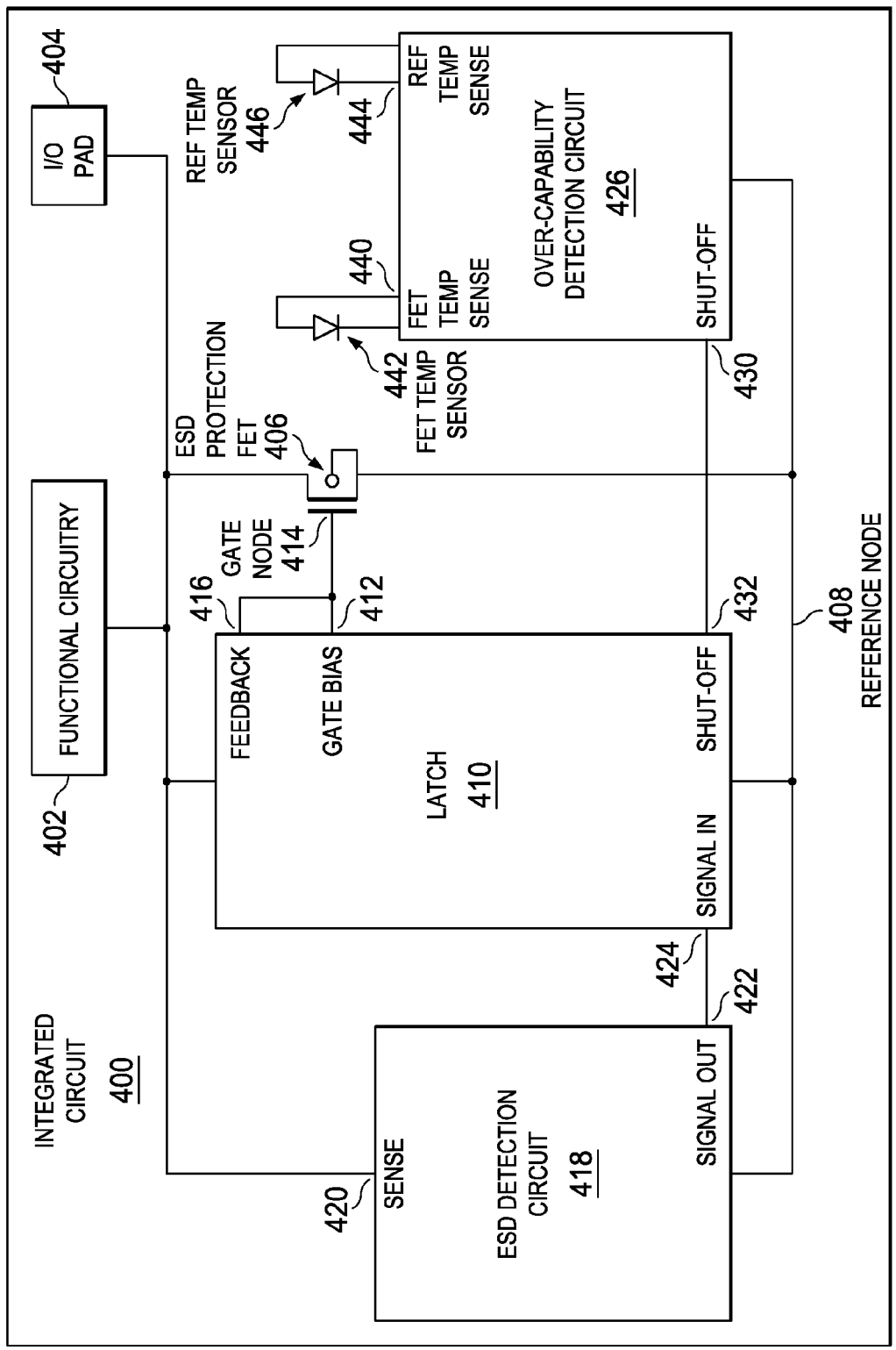
FIG. 4 is a block schematic diagram of an integrated circuit containing a further example over-capability detection circuit.

FIG. 4 is a block schematic diagram of an integrated circuit containing a further example over-capability detection circuit. The integrated circuit 400 includes functional circuitry 402, an I/O pad 404 coupled to the functional circuitry 402, an ESD protection FET 406 coupled between the I/O pad 404 and a reference node 408, a latch 410 with a gate bias functionality 412 and a feedback port 416 coupled to a gate node 414 of the ESD protection FET 406, and an ESD detection circuit 418 coupled to the I/O pad 404 through a sense functionality 420 and coupled to the latch 410 through a signal-out port 422 of the ESD detection circuit 418 and through a signal-in port 424 of the latch 410.

The integrated circuit 400 further includes an over-capability detection circuit 426 with a FET temperature sense functionality 440 coupled to a FET temperature sensor 442 located proximate to the ESD protection FET 406, and possibly a reference temperature sense functionality 444 coupled to a reference temperature sensor 446. The FET temperature sensor 442 and the reference temperature sensor 446 are depicted in FIG. 4 as diodes 442 and 446, but may be any form of temperature sensors. The over-capability detection circuit 426 has a shut-off output port 430 which is coupled to a shut-off input port 432 of the latch 410.

When an ESD event occurs at the I/O pad 404, the ESD protection FET 406 is turned on by the combined action of the ESD detection circuit 418 and the latch 410 to protect the functional circuitry 402, as described in reference to FIG. 2. When an EOS event occurs, the ESD protection FET 406 is turned on by the combined action of the ESD detection circuit 418 and the latch 410, causing a large amount of current to flow through the ESD protection FET 406, which causes a temperature of the ESD protection FET 406, and a temperature of the FET temperature sensor 442, to rise. The temperature of the FET temperature sensor 442 is sensed by the FET temperature sense functionality 440 of the over-capability detection circuit 426 to provide an estimate of the temperature of the ESD protection FET 406. The over-capability detection circuit 426 may optionally use an estimate of a temperature of the reference temperature sensor 446 provided by the reference temperature sense functionality 444 to estimate a temperature rise of the ESD protection FET 406 relative to other areas of the integrated circuit 400. When the estimated temperature of the ESD protection FET 406 drops to a level that indicates a safe operating condition has been attained, a shut-off signal is provided through the shut-off output port 430 to the latch 410 through the shut-off input port 432. The latch 410 then provides an off-state bias through the gate bias functionality 412 to the gate node 414 and so turns off the ESD protection FET 406. Using the FET temperature sensor 442 and the FET temperature sense functionality 440 may advantageously reduce components which add impedance in series with the ESD protection FET 406 and/or parasitic leakage on the I/O pad 404. Using the reference temperature sensor 446 and the reference temperature sense functionality 444 may provide a more accurate estimate of attainment of the safe operating condition.

Figure 5:
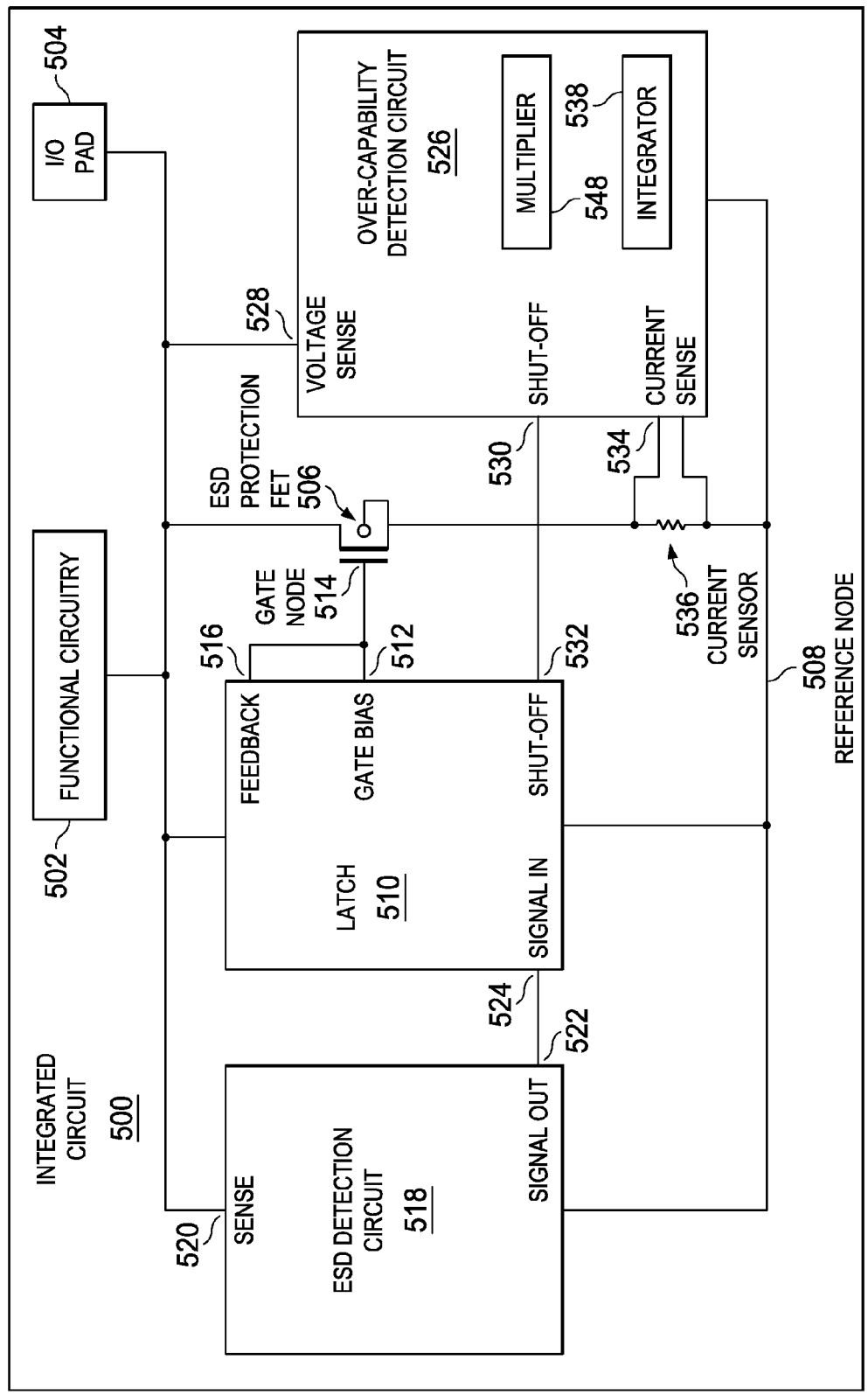
FIG. 5 is a block schematic diagram of an integrated circuit containing another example over-capability detection circuit.

FIG. 5 is a block schematic diagram of an integrated circuit containing another example over-capability detection circuit. The integrated circuit 500 includes functional circuitry 502, an I/O pad 504 coupled to the functional circuitry 502, an ESD protection FET 506 coupled between the I/O pad 504 and a reference node 508, a latch 510 with a gate bias functionality 512 and a feedback port 516 coupled to a gate node 514 of the ESD protection FET 506, and an ESD detection circuit 518 coupled to the I/O pad 504 through a sense functionality 520 and coupled to the latch 510 through a signal-out port 522 of the ESD detection circuit 518 and through a signal-in port 524 of the latch 510.

The integrated circuit 500 further includes an over-capability detection circuit 526 with a voltage sense functionality 528 coupled to the I/O pad 504, and a current sense functionality 534 coupled to a current sensor 536 in series with the ESD protection FET 506. The over-capability detection circuit 526 includes a multiplier functionality 548 which uses outputs of the voltage sense functionality 528 and the current sense functionality 534 to provide an estimate of power dissipated in the ESD protection FET 506. The over-capability detection circuit 526 has a shut-off output port 530 which is coupled to a shut-off input port 532 of the latch 510. The over-capability detection circuit 526 has a shut-off output port 530 which is coupled to a shut-off input port 532 of the latch 510.

When an ESD event occurs at the I/O pad 504, the ESD protection FET 506 is turned on by the combined action of the ESD detection circuit 518 and the latch 510 to protect the functional circuitry 502, as described in reference to FIG. 2. When an EOS event occurs, the ESD protection FET 506 is turned on by the combined action of the ESD detection circuit 518 and the latch 510. A voltage across the ESD protection FET 506 is sensed by the voltage sense functionality 528, and a current through the ESD protection FET 506 is sensed by the current sense functionality 534. The multiplier functionality 548 multiplies a signal from the voltage sense functionality 528 and a signal from the current sense functionality 534 to provide an estimate of power dissipated in the ESD protection FET 506. When the estimated power dissipated in the ESD protection FET 506 drops to a level that indicates a safe operating condition has been attained, a shut-off signal is provided through the shut-off output port 530 to the latch 510 through the shut-off input port 532. The latch 510 then provides an off-state bias through the gate bias functionality 512 to the gate node 514 and so turns off the ESD protection FET 506. Efficient operation of the ESD protection FET 506 may be a function of the power dissipated in the ESD protection FET 506. Using the estimate of power dissipated from the voltage sense functionality 528, the current sense functionality 534 and the multiplier functionality 548 may advantageously provide a desired balance between protection of the functional circuitry 502 and efficient operation of the ESD protection FET 506.

Reliability of the ESD protection FET 506 may be a function of the total energy dissipated in the ESD protection FET 506. The over-capability detection circuit 526 may optionally have an integrator 538 which is operable to integrate a signal from the multiplier functionality 548 to provide an estimate of total energy dissipated in the ESD protection FET 506 in a time period of interest. The time period of interest may start, for example, when the ESD protection FET 506 is turned on. The integrator 538 may provide an estimate of a total energy dissipated the ESD protection FET 506 during the EOS event, which may be used to determine a desired time to provide the shut-off signal to the latch 510. Using the integrator 538 to estimate attainment of the safe operating condition may advantageously provide a desired balance between protection of the functional circuitry 502 and reliability of the ESD protection FET 506.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
   a functional circuitry;
   an input/output (I/O) pad coupled to functional circuitry;
   an electrostatic discharge (ESD) protection shunting component coupled between the I/O pad and a reference node of the integrated circuit;
   a latch configured to turn on the ESD protection shunting component in response to an ESD signal and to turn off the ESD protection shunting component in response to a shut-off signal;
   an ESD detection circuit coupled with said I/O pad, the ESD detection circuit configured to provide the ESD signal to the latch which causes said latch to turn on the ESD protection shunting component; and
   an over-capability detection circuit including a current sensor coupled in series with the ESD protection shunting component, the over-capability detection circuit configured to provide the shut-off signal to the latch which causes said latch to turn off the ESD protection shunting component.

2. The integrated circuit of claim 1, wherein said ESD shunting component includes an ESD protection field effect transistor (FET).

3. The integrated circuit of claim 1, wherein the the over-capability detection circuit includes a voltage sensor coupled with said I/O pad.

4. The integrated circuit of claim 1, wherein said over-capability detection circuit includes an integrator operable to integrate a signal from the current sensor to provide an estimate of total charge through the ESD protection shunting component within a predetermined time period.

5. The integrated circuit of claim 1, wherein the current sensor includes a resistor coupled in series with the ESD protection shunting component.

6. The integrated circuit of claim 1, wherein the over-capability detection circuit includes a temperature sensor located proximate to the ESD protection shunting component.

7. The integrated circuit of claim 6, wherein the over-capability detection circuit includes a reference temperature sensor.

8. The integrated circuit of claim 1, wherein the over-capability detection circuit includes a voltage sensor coupled to said I/O pad, and a multiplier configured to use outputs of the voltage sensor and the current sensor to provide an estimate of power dissipated in the ESD protection shunting component.

9. The integrated circuit of claim 8, wherein the over-capability detection circuit includes an integrator configured to integrate a signal from multiplier to provide an estimate of total energy dissipated in said ESD protection shunting component in the predetermined time period.

10. A method of operating an integrated circuit, comprising of:
    detecting a voltage excursion at an I/O pad of the integrated circuit with an ESD detection circuit of the integrated circuit, said ESD detection circuit having a sensor coupled to said I/O pad;
    subsequently sending an ESD signal from the ESD detection circuit to a latch of the integrated circuit;
    subsequently providing an on-state bias to an ESD protection shunting component from the latch for turning on the ESD protection shunting component, the ESD protection shunting component coupled to the I/O pad;
    subsequently providing a shut-off signal to the latch from an over-capability detection circuit including a current sensor coupled in series with the ESD protection shunting component; and
    subsequently providing an off-state bias to the ESD protection shunting component from the latch for turning off the ESD protection shunting component.

11. The method of claim 10, wherein said ESD shunting component includes an ESD protection FET.

12. The method of claim 10, wherein the over-capability detection circuit includes a voltage sensor coupled with said I/O pad.

13. The method of claim 10, wherein over-capability detection circuit includes an integrator configured to integrate a signal from the current sensor to provide an estimate of total charge through the ESD protection shunting component within a predetermined time period.

14. The method of claim 10, wherein the current sensor includes a resistor coupled in series with the ESD protection shunting component.

15. The method of claim 10, wherein the over-capability detection circuit includes a temperature sensor located proximate to the ESD protection shunting component, the temperature sensor providing an estimate of a temperature of the ESD protection shunting component.

16. The method of claim 15, wherein the over-capability detection circuit includes a reference temperature sensor.

17. The method of claim 10, wherein the over-capability detection circuit includes a voltage sensor coupled to said I/O pad, and a multiplier configured to use outputs of the voltage sensor and the current sensor to provide an estimate of power dissipated in the ESD protection shunting component.

18. The method of claim 17, wherein the over-capability detection circuit includes an integrator configured to integrate a signal from multiplier to provide an estimate of total energy dissipated in said ESD protection shunting component in the predetermined time period.

* * * * *